(12) United States Patent
De Vreede et al.

(10) Patent No.: US 11,996,839 B2
(45) Date of Patent: May 28, 2024

(54) DIGITAL TRANSMITTER WITH HIGH LINEARITY FOR WIDEBAND SIGNALS

(71) Applicant: Technische Universiteit Delft, Delft (NL)

(72) Inventors: Leonardus Cornelis Nicolaas De Vreede, Delft (NL); Yiyu Shen, Delft (NL); Seyed Morteza Alavi, Delft (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 17/912,870

(22) PCT Filed: Mar. 19, 2021

(86) PCT No.: PCT/NL2021/050187
§ 371 (c)(1),
(2) Date: Sep. 20, 2022

(87) PCT Pub. No.: WO2021/187986
PCT Pub. Date: Sep. 23, 2021

(65) Prior Publication Data
US 2023/0143414 A1    May 11, 2023

(30) Foreign Application Priority Data

Mar. 20, 2020   (NL) ..................................... 2025171

(51) Int. Cl.
*H03K 17/693*  (2006.01)
*H03M 1/74*  (2006.01)
(52) U.S. Cl.
CPC .......... *H03K 17/693* (2013.01); *H03M 1/742* (2013.01)
(58) Field of Classification Search
CPC ... H03K 17/693; H03K 17/145; H03K 17/165
See application file for complete search history.

(56) References Cited

U.S. PATENT DOCUMENTS

| 10,056,924 B2 | 8/2018 | Schafferer et al. |
| 2005/0191976 A1* | 9/2005 | Shakeshaft ........... H03F 1/0222 455/127.1 |

(Continued)

FOREIGN PATENT DOCUMENTS

| EP | 3113158 A1 | 1/2017 |
| WO | 2007021863 A1 | 2/2007 |

OTHER PUBLICATIONS

P. Eloranta, et al., "A Multimode Transmitter in 0.13 m CMOS using Direct-Digital RF Modulator," IEEE JSSC, vol. 42, No. 12, pp. 2774-2784, Dec. 2007.

(Continued)

*Primary Examiner* — Sibin Chen
(74) *Attorney, Agent, or Firm* — N.V. Nederlandsch Octrooibureau

(57) ABSTRACT

An RF transmitter having one or more common-gate, CG, or common-base, CB, configured output stages, and a digitally controlled current source having a plurality of unit cells connected to the output stages, each of the plurality of unit cells comprising a current source. The digitally controlled current source is configured for driving the output stages with respective driving currents originating from the associated current source in each of the plurality of unit cells, in dependence of one or more input signals. The digitally controlled current source further comprises a current diversion path in each of the plurality of unit cells for providing a diversion current to a voltage source having a voltage lower than drain/collector terminals of transistors provided in the CG/CB configured output stages.

14 Claims, 11 Drawing Sheets

(56) References Cited

U.S. PATENT DOCUMENTS

| | | | |
|---|---|---|---|
| 2017/0005654 A1* | 1/2017 | Zhang | H03F 3/245 |
| 2019/0229720 A1* | 7/2019 | Bakalski | H03K 17/102 |
| 2021/0194565 A1* | 6/2021 | Paramesh | H04B 7/0617 |

OTHER PUBLICATIONS

C. Erdmann et al., "A 330 mW 14 b 6.8 GS/s dual-mode RF DAC in16 nm FinFET achieving—70.8 dBc ACPR in a 20 MHz channel at5.2 GHZ," in IEEE ISSCC Dig. Tech. Papers, Feb. 2017, pp. 280-281.

Z. Deng, et al., "A dual-band digital-WiFi 802.11a/b/g/n transmitter SoC with digital I/Q combining and diamond profile mapping for compact die area and improved efficiency in 40nm CMOS". ISSCC, pp. 172-173, Feb. 2016.

M.S. Alavi, R.B. Staszewski, L.C.N. de Vreede, J.R. Long, "Orthogonal summing and power combining network in a 65-nm all-digital RF I/Q modulator," Radio-Frequency Integration Technology (RFIT), 2011 IEEE International Symposium, 2011, pp. 21-24.

Mohammadreza Mehrpoo, Mohsen Hashemi, Yiyu Shen, Leo De Vreede, Morteza Alavi, "A Wideband Linear I/Q-Interleaving Direct Digital RF Modulator". IEEE Journal of Solid-State Circuits, 2018, vol. 53, Issue: 5.

Varish Diddi ; Shuichi Sakata ; Shintaro Shinjo ; Voravit Vorapipat; Richard Eden ; Peter Asbeck, Broadband digitally-controlled power amplifier based on CMOS / GaN combination, 2016 IEEE.

N. Markulic, et al., "A 5.5-GHz Background-Calibrated Subsampling Polar Transmitter With—41.3—dB EVM at 1024 QAM in 28-nm CMOS", IEEE Journal of Solid-State Circuits, 2019, vol. 54, Issue: 4adio Frequency Integrated Circuits Symposium (RFIC).

M. Kalcher et al:"Fully-digital transmitter architectures and circuits for the next generation of wireless communications", Elektrotechnik & Informationstechnik (2018) 135/1: 89-98. https://doi.org/10.1007/s00502-017-0573-4.

Chin-Fu Li et al:"A 4.8-mW 4-GHz CMOS Class-B-Like Down-Converter for Harmonic Mixing Rejection", IEEE Transactions On Microwave Theory and Techniques, vol. 59, No. 10, Oct. 2011.

Wagdy M. Gaber et al:"A 21-dBm I /Q Digital Transmitter Using Stacked Output Stage in 28-nm Bulk CMOS Technology", IEEE Transactions On Microwave Theory and Techniques, vol. 65, No. 11, Nov. 2017.

Vishnu Ravinuthula et al:"A 14-bit 8:9GS/s RF DAC in 40nm CMOS achieving >71dBc LTE ACPR at 2:9GHZ", 2016 Symposium on VLSI Circuits Digest of Technical Papers.

* cited by examiner

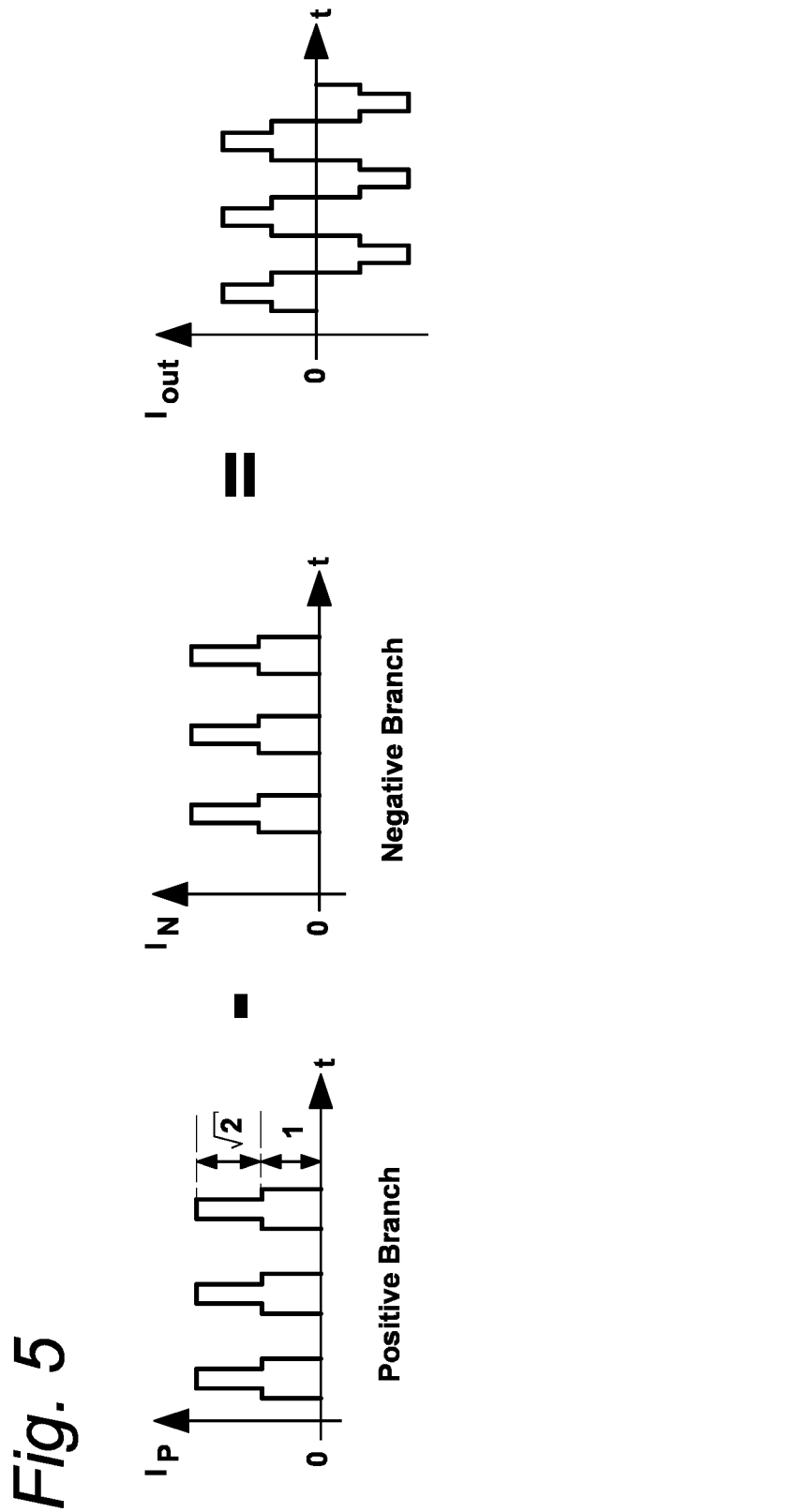

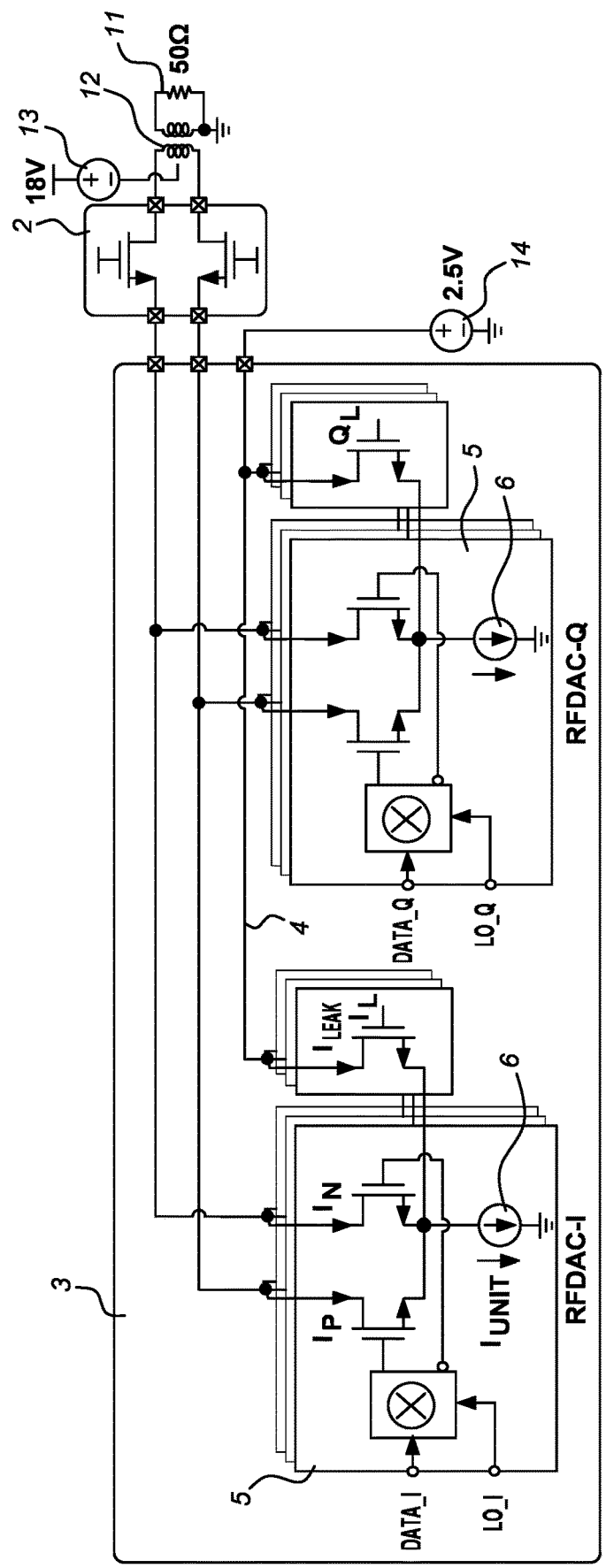

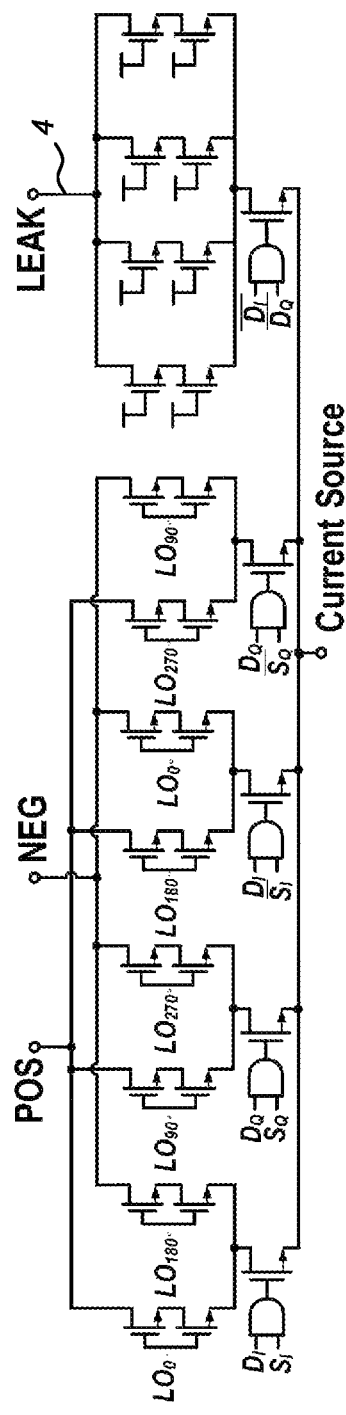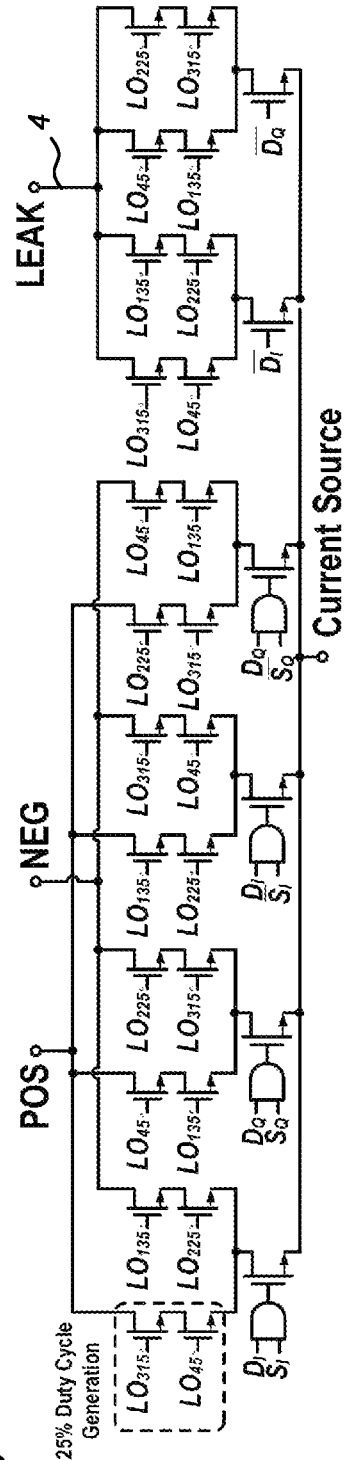
Fig. 9A
Fig. 9B

DIGITAL TRANSMITTER WITH HIGH LINEARITY FOR WIDEBAND SIGNALS

RELATED APPLICATIONS

This application is a national phase entry of PCT application PCT/NL2021/050187 filed on Mar. 19, 2021, which claims priority to Dutch patent 2025171 filed on Mar. 20, 2020, the contents of both of which are fully incorporated by reference herein.

Field of the Invention

The present invention relates to an RF transmitter comprising one or more common-gate, CG, or common-base, CB, configured output stages, and a digitally controlled current source having a plurality of unit cells connected to the one or more CG/CB configured output stages.

Background Art

The article by V. Diddi et al. entitled "Broadband digitally-controlled power amplifier based on CMOS/GaN combination," 2016 IEEE Radio Frequency Integrated Circuits Symposium (RFIC), San Francisco, CA, 2016, pp. 258-261, discloses a digital RF power transmitter configuration with a control part and (single) amplifier stage, wherein the control part provides an analogue signal to the power amplifier stage.

The article by M. Mohammadreza Mehrpoo, Mohsen Hashemi, Yiyu Shen, Leo De Vreede, Morteza Alavi, "A Wideband Linear I/Q-Interleaving Direct Digital RF Modulator". IEEE Journal of Solid-State Circuits, 2018, Volume: 53, Issue: 5, describes a current mode direct digital RF modulator, using an interleaved IQ architecture for the implementation of its RFDAC function.

US Patent publication U.S. Pat. No. 9,432,036 discloses a radio frequency current steering digital to analog converter (RFDAC). A current steering cell in a DAC includes a source-coupled transistor pair responsive to a differential gate voltage. A current source is coupled to the source-coupled transistor pair and is operable to source a bias current. In a regular baseband mode of operation, the data passes through combinatorial logic to the driver without modification. In an RF mode of operation, the combinatorial logic is enabled to perform an exclusive OR of the data and the clock and the output is coupled to the driver. As such, an RF DAC can be implemented without the need for a mixer in the signal chain. Further, only a pair of transistor switches are needed for each current steering cell, and the switches, drivers, and combinatorial logic all remain in the thin oxide domain.

European patent application EP-A-3 113 358 discloses an RF transmitter with a number of output stage unit cells, each having a current source. In one embodiment, a bleeder current source is provided which during operation adds a bleeder current in the signal path branch to keep a small amount of current through the current source, improving the unit cell performance. The unit cell is kept on with a small current, which speeds up the internal nodes.

International patent publication WO2007/021863 discloses a current-steering type digital-to-analog converter, having a first sub-DAC and a second sub-DAC. A controlling device selectively and periodically sends output signals of either the first sub-DAC or the second sub-DAC to a resistive load while sending output signals of the remaining one of the two sub-DACs to a dummy resistive load.

US patent publication US2015/0171878 discloses a digital-to-analog converter system with a parallel DAC structure and an aggregate current output.

SUMMARY OF THE INVENTION

The present invention seeks to provide an improved RF transmitter, which is specifically suited for high-speed, high-frequency, high linear wideband RF power applications, such as, Wi-Fi, small-cell, and 5G mMIMO base stations.

According to the present invention, an RF transmitter as defined above is provided, wherein each of the plurality of unit cells comprises a current source, wherein the digitally controlled current source is configured for driving the one or more CG/CB configured output stages with respective driving currents originating from the associated current source in each of the plurality of unit cells, in dependence of one or more input signals, and wherein the digitally controlled current source further comprises a current diversion path in each of the plurality of unit cells for providing a diversion current to a voltage source having a voltage lower than drain/collector terminals of transistors provided in the CG/CB configured output stages.

The proposed configuration is specifically suitable for wireless applications in the low to medium power range (0.5-5W), such as Wi-Fi, small-cell and mMIMO base stations that aim to avoid the use of power-hungry digital pre-distortion (DPD).

SHORT DESCRIPTION OF DRAWINGS

The present invention will be discussed in more detail below, with reference to the attached drawings, in which FIG. 1A shows a schematic diagram of a plurality of unit cells for a Gilbert-cell based DDRM (prior art), and FIG. 1B shows a schematic diagram of a plurality of unit cells implementing a digital XOR-based DDRM (prior art).

FIG. 5 shows the current graphs for positive, negative and summed output for an embodiment applying harmonic rejection for use in class-B/class-F like conditions, in single-ended and differential/push-pull conditions.

FIGS. 9A and 9B show detailed schematic diagrams for a mixing unit with a 50% mixing-DAC, respectively a 25% mixing-DAC along with their leakage paths.

DESCRIPTION OF EMBODIMENTS

Figure 1A:
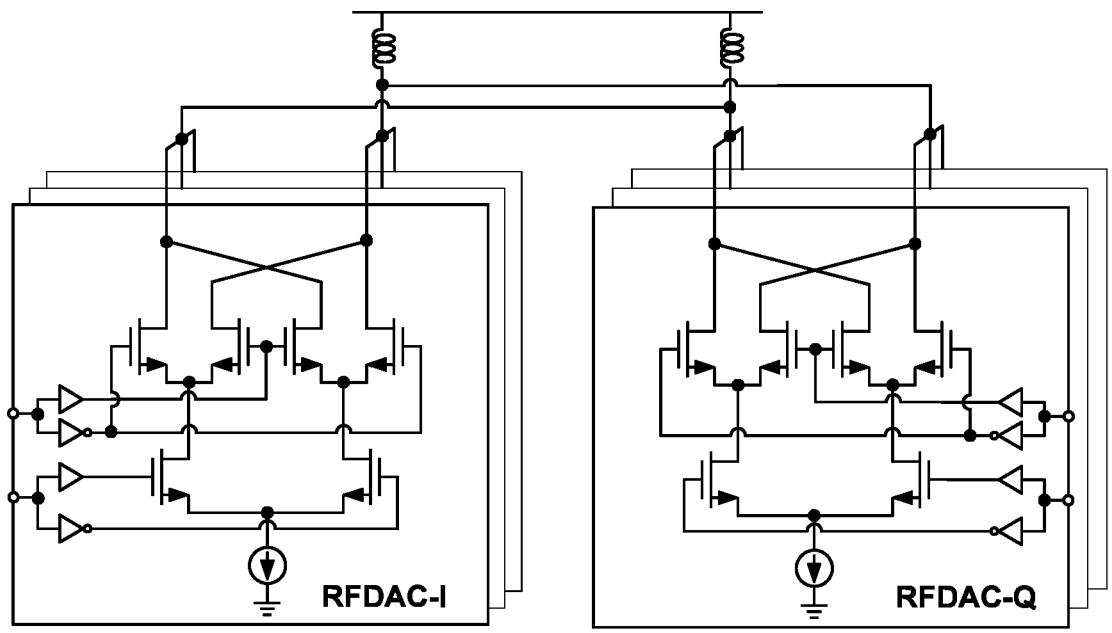

The present invention relates to the general need for highly-linear, wideband, energy-efficient, highly-integrated, low-cost transmitter (TX) line-ups for use in the low to medium power wireless applications like Wi-Fi, small-cell base stations, 5G mMIMO base stations and DOCSIS.

Currently, the RF transmitter market is dominated by analogue-intensive TX solutions, which need power-hungry, linear analogue up-conversion chains, drivers and a final power amplifier (PA) stage in order to reach the transmit power levels of interest. Typically, these PA's us a common-source (CS) or common-emitter (CE) configured active devices for their high gain. Depending on their linearity and/or efficiency requirements these CS or CE devices are biased in class-A/AB—class-B, and use analogue clipping of the current waveform when aiming for higher efficiency (e.g. a rectified sine wave as in class-B). However, their input-to-output signal transfer suffers from nonlinear distortion due this analogue clipping, as well as, from their non-linear input-voltage—output current (transconductance) signal transfer. Also, the internal feedback in CS/CE stages due to non-linear Miller capacitances degrades the achievable linearity. This all will contribute to the distortion of the transmitter (TX) output signal, no matter how linear the pre-driver of the final power stage is. Consequently, to meet the linearity requirements of modern wireless systems (e.g. in terms of error-vector-magnitude (EVM) and adjacent channel leakage ratio (ACLR)) these output stages, need to be operated towards class-AB—Class-A conditions, which increases significantly their quiescent current and power consumption. In addition, to remain linear, they need to use power back-off operating conditions that keep them relative far from their 1 dB compression point, which further degrades their achievable efficiency. To operate closer to compression, digital pre-distortion (DPD) techniques can be used to correct for the device non-linearity. However, use of DPD leads to a large increase in system complexity and power consumption due to this DPD system overhead (typically 0.5-5W is needed for DPD implementation depending on the signal bandwidth). As a result, the impact of using DPD in wireless systems with a relative low RF output power (e.g. <5W) has a rather dramatic impact on the overall TX line-up efficiencies of these systems.

One approach to implement linear transmitters and avoid the impact of the non-linear trans-conductance in the PA output stage, and as such omit DPD, is the use of common-gate (CG) or common-base (CB) stage in current-mode operation. The input—output current relation of a CG/CB stage is close to perfectly linear, as will be the related output signal. The challenge however, is how to create the optimum current-wave forms to drive these CG/CB stages. These waveforms should result in a highly linear as well as energy efficient wideband operation of the overall transmitter unit. In the present invention embodiments as disclosed herein, a novel RF architecture (a "digital cascode" configuration) is applied which uses a digitally controlled current source to provide the optimum current waveforms to drive a CG/CB output stage, as such forming a linear, wideband energy efficient transmitter, which does not need DPD. The digitally controlled current source may be implemented as an RF digital-to-analogue converter (RFDAC) or as a direct digital RF modulator (DDRM).

A logic approach to the given problem statement, and at the same time, benefit fully from the progress in nanoscale CMOS technologies, is the use of RF digital-to-analog converters (RFDACs) or mixing-DACs architectures.

To mitigate the linearity problem and drive the CG/CB state in current mode, a DDRM can be used. Various DDRM implementations have been reported with polar architectures, as well as, with Cartesian architectures. Overall one can state that current-steering based DDRMs aiming for high quality output spectrum, use accurately weighted current sources to construct their output signal with related excellent ACLR and EVM. This is possible by their exclusive use of always-on current sources, which effectively demands class-A like operation conditions of the DDRM.

Figure 1B:
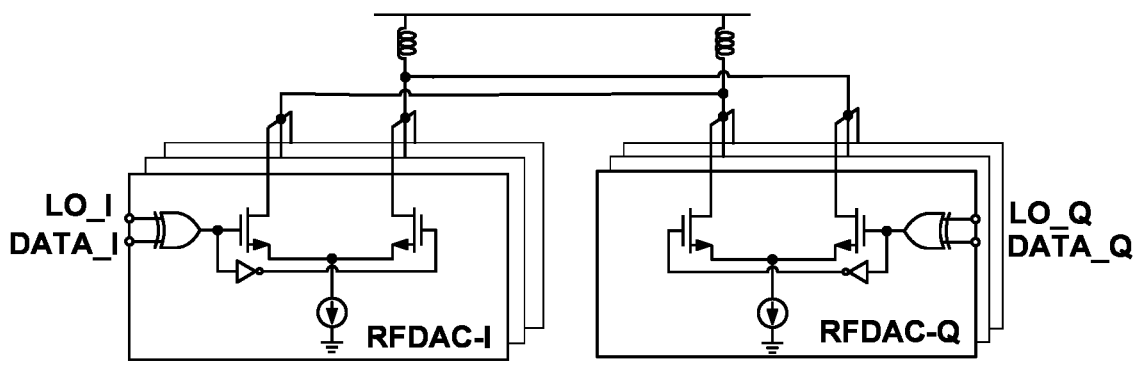

This class-A like operation can also be concluded from schematics of the concepts shown in FIGS. 1A and 1B, which indicates that the current provided by the unit cell current sources is always directed though the unit switch-cores to be summed at the (differential) output. FIG. 1A shows a schematic diagram of a plurality of unit cells for a Gilbert-cell based DDRM, and FIG. 1B shows a schematic diagram of a plurality of unit cells implementing a digital XOR-based DDRM.

In the signal condition of no AC output signal, half of the unit cells will direct its current to the positive output, and the other half to the negative output terminal, which is toggled with the RF clock, but since they are both equal, result in effectively zero power RF output signal. At maximum RF output power, the unit cell currents are summed in phase and are alternating between the positive and negative output terminals. Both conditions, effectively represent a class-A like bias situation, with associated efficiency performance. An alternative way of describing this situation would be to state that in the case of a Cartesian architecture the original IQ data has been moved to the first quadrant yielding an unsigned operation. Note that this situation does not need phase changes of the clocks driving the unit cells, again helping to achieve a highly accurate output signal representation.

The choice to keep these current sources effectively always on can be understood by considering the following. In order to implement a high resolution DDRM (e.g. with more than 8 bits) the DDRM current sources need to be accurately matched to each other such that they offer exactly the intended (thermometer/binary) weighted currents ratios with respect to each other. This requires physical upscaling of their component dimensions (both transistors and resistors), and consequently, their related parasitic loading capacitances. When these current sources are operated always in their on-state, they will provide their highest accuracy, since their parasitic capacitances will not affect their DC current ratios. Therefore, it is common practice in high linearity DDRMs to keep the current sources of all unit cells on and simply redirect their outputs and sum these at the output terminals of the DDRM.

Figure 2:
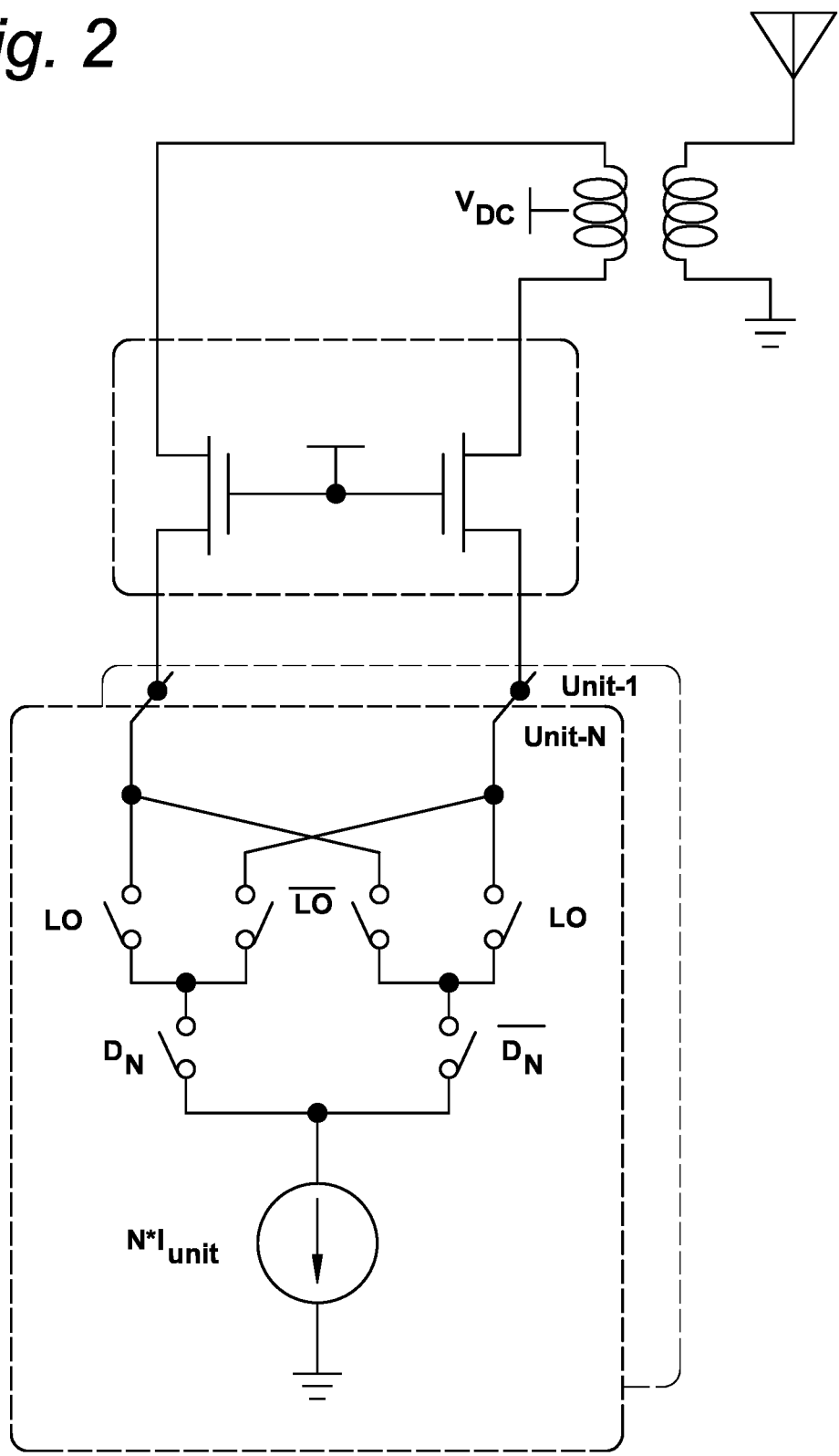
FIG. 2 shows a prior art implementation of a polar differential/push-pull DDRM with high voltage GaN in class-A like conditions.

As stated, earlier DDRM can be used to drive a CS/CE output stage to reach the TX power levels of interest (see prior art implementation of a polar differential/push-pull DDRM as shown in FIG. 2). However, when optimized for efficiency, these output stages need to be operated in class-B or class AB. As such these output stages use analogue signal clipping, which combined with the non-linear trans-conductance, will put limits on the linearity of the overall TX line-up. However, as earlier indicated such a DDRM can also be used to current-mode drive directly a CG/CB power output stage to benefit from its linear input-output current relation. However, the later configuration is far less common, since it requires the DDRM to handle the full RF output current (current gain CG/CB stage equals ~1). In addition, current steering DDRMs use the unsigned IQ/class-A like operation, due to their always on unit cell current sources. This will automatically place the CG/CB stage also in class-A, as such constraining the achievable efficiency of this TX configuration.

Figure 3:
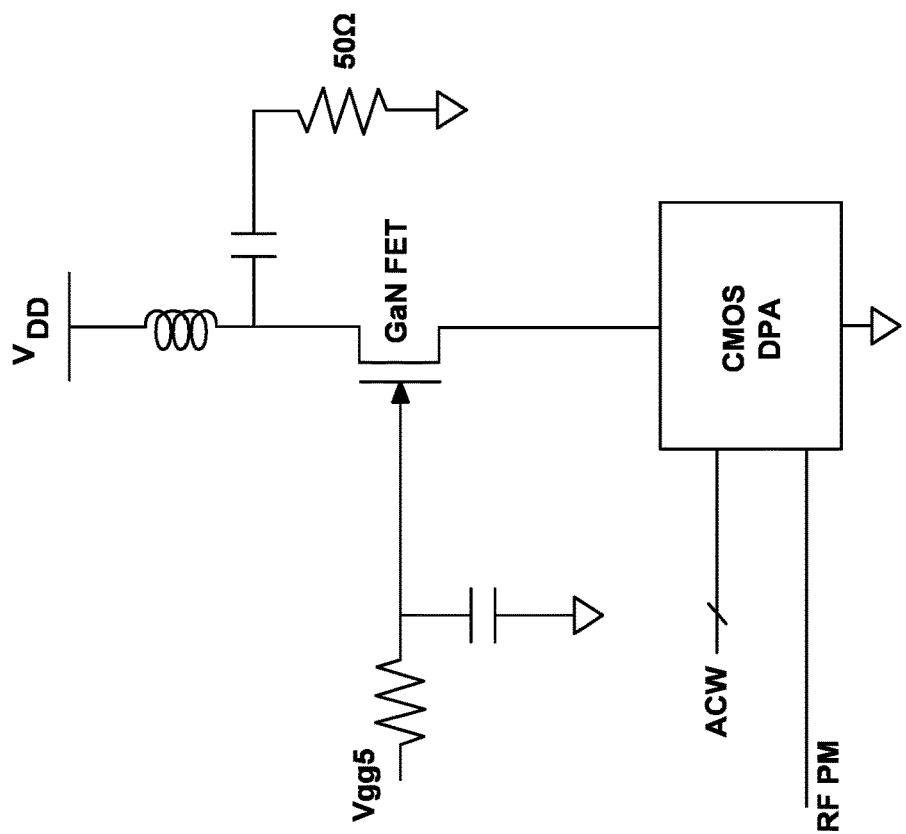
FIG. 3 shows a prior art implementation of a polar DDRM in single-ended configuration using class-B like drive conditions by switching off unit cells and their related current contribution.

In principle, one could choose to activate and deactivate these DC current sources in the unit cells and activate them with the envelope of the modulated signal. This would result in a class-B like operation of the output stage, with related efficiency improvement. However, doing so would require extremely fast response times of these current sources, which is impractical due to their large parasitic capacitances. As result the generated output currents of the unit cells would be inaccurate and non-linear signal distortion would occur, which requires the use of power-hungry digital pre-distortion techniques to correct for this. An example of such single-ended configuration is given in reference [6], and a circuit diagram is shown in FIG. 3. In this work the SOI implemented DDRM is driving a single ended high-voltage GaN CG output stage in order to reach the power levels of interest (several Watts). In this implementation the unit cells are completely switched off and as such control the output power. Using this rather straight forward simple approach, the realized circuitry fails to achieve a linear amplitude code word ACW to RF output signal transfer. It is noted that in reference [6] SOI device stacking is used to be able to drive the GaN device.

The present invention embodiments aim to keep the current sources in the unit cells of the DDRM always on, while being able to provide a "class-B like" RF current wave form on its output terminals to drive in current-mode a CG/CB stage such that it can operate both energy efficient, as well as, linear. According to the present invention, an RF transmitter 1 is provided comprising one or more common-gate, CG, or common-base, CB, configured output stages 2, and a digitally controlled current source 3 having a plurality of unit cells 5 connected to the one or more CG/CB configured output stages 2. Each of the plurality of unit cells 5 comprises a current source 6. The digitally controlled current source 3 is configured for driving the one or more CG/CB configured output stages 2 with respective driving currents IN; IP originating from the associated current source 6 in each of the plurality of unit cells 5, in dependence of one or more input signals. Furthermore, the digitally controlled current source 3 comprises a current diversion path 4 in each of the plurality of unit cells 5 for providing a diversion current IL to a voltage source 14 having a voltage lower than drain/collector terminals of transistors provided in the CG/CB configured output stages 2.

Figure 4:
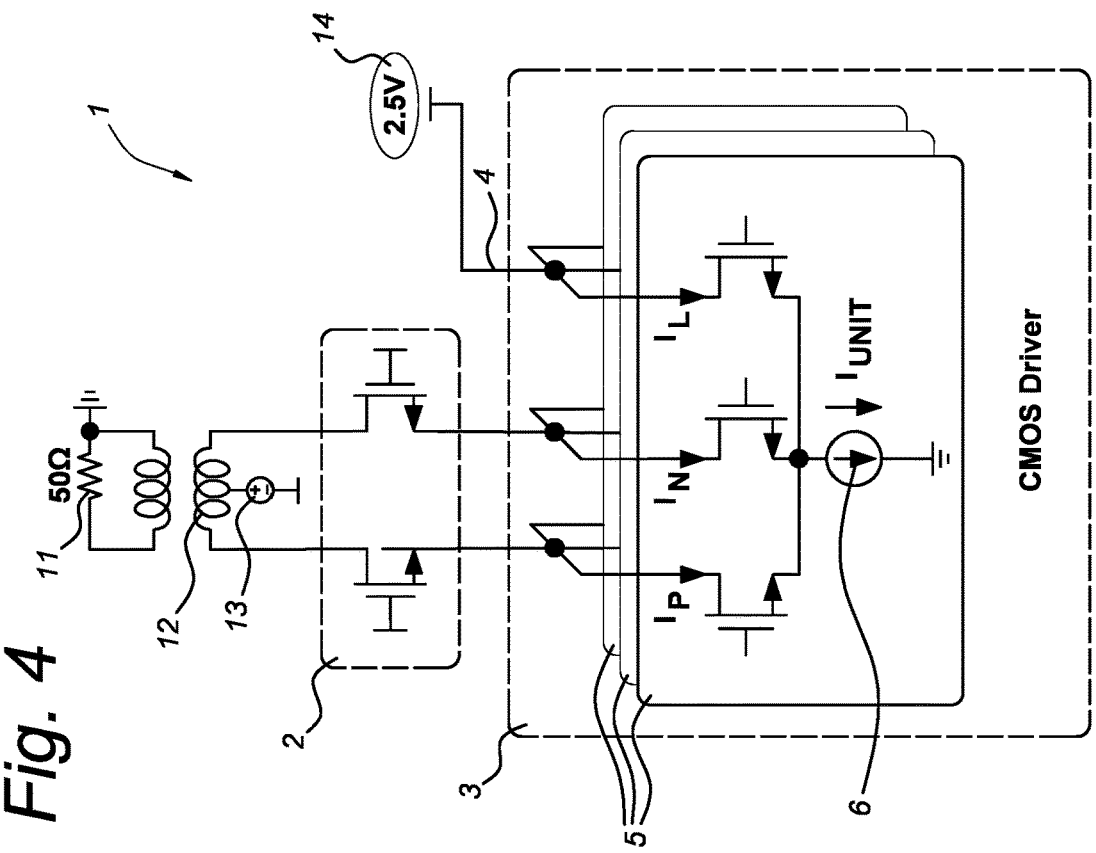
FIG. 4 shows a schematic diagram of an exemplary embodiment of the power RF transmitter according to the present invention.

In other words, to achieve this property, a current diversion path 4 is introduced as shown in the exemplary embodiment of an RF transmitter as shown in FIG. 4, implementing a basic configuration of a polar "Digital Cascode" digitally controlled current source 3 with a differential high-voltage GaN CG configured output stage 2, using signed/class-B like operation with the aid of a current diversion path 4. Note that such a current diversion path 4 may be applied in the various RF transmitter implementations as discussed above, i.e. the digitally controlled current source 3 may comprise a direct digital RF modulator, DDRM, or alternatively, may comprise a RF digital-to-analogue converter, RFDAC.

In the embodiment shown in FIG. 4 it is shown that the RF transmitter 1 comprises one CG/CB configured output stage 2, that can be implemented on a high voltage GaN chip, and connected to an antenna or external load 11 via a transformer 12 with a DC voltage source 13 in a centre tap connection of the transformer 12 to provide the drain currents. The digitally controlled current source 3 is implemented as a DDRM on a CMOS chip (e.g., operating voltage 0-3V), and comprises N unit cells 5, each connected to a current diversion path 4. The current diversion path 4 is connected to a voltage source 14 providing the required diversion current, which voltage source is settable in the operating range of the CMOS chip (e.g. 0-3V). Each of the unit cells 5 comprise a (separate) current source 6 preset at a current value $I_{UNIT}$, as well as switch-like operating transistors for the positive output $I^+$, negative output $I^-$ and current diversion path 4, respectively.

Note that in the embodiment shown in FIG. 4, the CG/CB configured output stage 2 is differential. As an alternative, single-ended implementations can also be used as one of the present invention embodiments. Furthermore, the switch-like operating transistors implement the input processing of an input signal to the RF transmitter 1. In further alternative embodiments, the RF transmitter 1 may receive one or more input signals, which comprise one or more baseband signals in combination with one or more RF carrier signals and/or one or more RF reference clock signals.

Figure 7A:
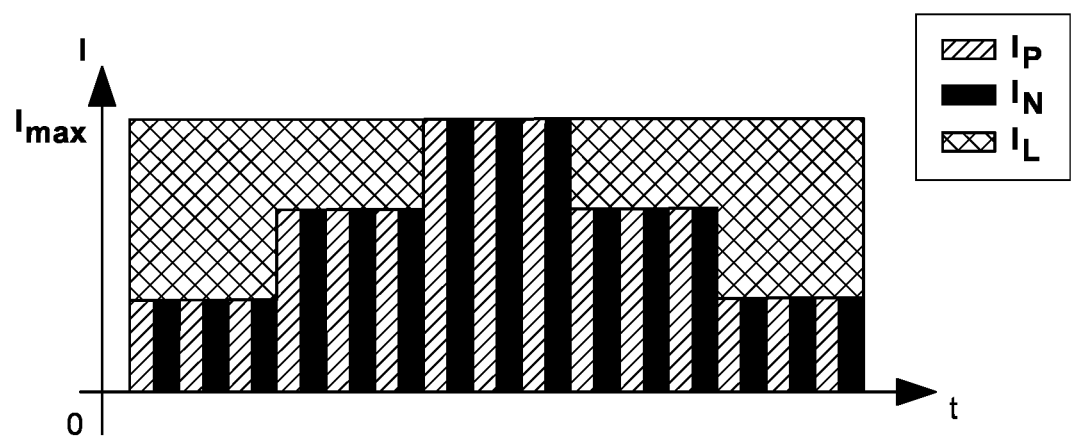
FIGS. 7A and 7B show the DDRM terminal currents without dynamic biasing, respectively with improved dynamic biasing using pre-activation of the unit cell current sources.

With the addition of this current diversion path 4 the DDRM current sources 6 can be kept always on. Namely, the total current of all branches ($I_p+I_n+I_l$) is kept constant and equal to the corresponding current source of the unit cells ($I_{UNIT}$), as shown in the diagram of FIG. 7A. So, these current sources 6 stay always on even when providing "class-B" like current waveforms to an (external) CG/CB configured output stage 2. At the same time the overall bias current to the DDRM 3 can be made constant (using voltage source 14) and as such its power dissipation and resulting operating temperature are constant as well. Both aspects contribute significantly to reduce memory effects and, as such, enhance the accuracy of the output currents that drive the GaN CG configured output stage 2 and logically its resulting output signal spectrum. Note that the DDRM topology in this approach needs a significant change over prior art implementations, since each unit cell 5 needs to be able to generate three different logical states, namely 1, 0, and −1, enabling the signed operation. This signed operation can now execute the clipping function in the digital domain in contrast to prior art which uses the analogue clipping, and as such can be used to support both to class-A like, as well as, class-B like current waveforms.

Note that high TX efficiency can be achieved in the proposed configuration by using a relative low voltage supply by the voltage source 14 for the current diversion path 4 connected to the DDRM 3, while using a relative high voltage supply to bias the drain/collector of the CG/CB configured output stage 2. In this configuration the CG/CB configured output stage 2 can be now directly driven with a class-AB, class-B/class-F or class-C like current waveforms by the DDRM 3 to reach high efficiency. Note that in this configuration it is beneficial to make use of a high break-down voltage technology for the CG/CB configured output stage 2, such that the $V_{drain}$ or $V_{collector}$ can be made significantly larger than $V_{leak}$ (of the voltage source 14).

Due to the fact that the voltage offered to the common-gate/common-base configured output stage 2 is significantly higher than the voltage used to bias the current diversion path 4 and the DDRM 3, the overall system efficiency can still approach the theoretical values of conventional class-B and class-F configurations when approaching its maximum output swing. E.g. when using 3V and 30V for the DDRM 3 and CG/CB configured output stage 2 respectively, in the ideal case with a rectified sinusoidal current waveform a 2% efficiency drop would occur with respect to the theoretical 78.5% peak efficiency for class-B results.

It is observed that simply alternating the output of the unit cell 5 currents, by the unit cell core switches controlled by the RF carrier between the positive and negative output terminals, does result in a rectified square wave current shape, rather than a rectified sinewave current which is normally associated with class-B operation. Note in view of this, providing a square-wave like (50% duty-cycle) current profile, will not directly yield the efficiency performance associated with class-B operation. Namely, realistic devices that have significant output capacitance are typically forced to use class-B like output matching networks (all higher harmonics short-circuited). In this case the square-wave current waveform will result in a relative large overlap with the sinusoidal output voltage waveform, this will restrict the achievable efficiency for a 50% duty cycle square wave current waveform to ~63.6% (theoretically), while having large odd-harmonic content in its associated output spectrum. This later fact, also degrades the in-band linearity of the aimed TX configuration through third-order intermodulation (IM3), as well as, the third-order counter intermodulation distortion (CIM3) mixing, of the spectral components over the always present non-linear imperfections of the output stage (e.g. non-linear capacitors or conductance).

Better performance can be achieved if the current wave form can be brought closer to the truncated sinewave profile that is typical for class-B/F. Since a time-continuous rectified sine-wave is basically an analogue function, digital intense circuits typically use a time discrete approximation. Consequently, to make this TX configuration function in a more optimum manner, and improve both on efficiency and linearity (lower the IM3 and CIM3), the 3rd and 5th-order harmonics in the output current waveform of the DRMM needs to be reduced. This can be achieved by introducing a harmonic rejection technique that is suited for class-B/class-F like truncated/clipped current waveforms. Thus, in a further embodiment, the digitally controlled current source 3 is arranged to apply harmonic rejection by controlling a bias current $I_{UNIT}$ of the current source 6.

Harmonic rejection, HR, is a popular technique for approaching a sine wave in class-A like RFDAC operation. In these applications typically three properly scaled switch banks are used, with three clocking signals to reject the third and fifth harmonics. Non class-A HR techniques, are less common and has been only recently used to implement an inverse class-D polar transmitter [7] intended for narrowband applications. By using a modified version of this technique featuring two parallel current-mode RFDACs as digitally controlled current source 3, one with 25% duty-cycle clock and a relative current that is a factor $\sqrt{2}$ larger than the parallel 50% duty-cycle clock driven RFDAC, an output current is obtained that will have no third and fifth harmonic components. Using differential/push-pull operation also the even harmonic content can be cancelled in the output.

Figure 6:
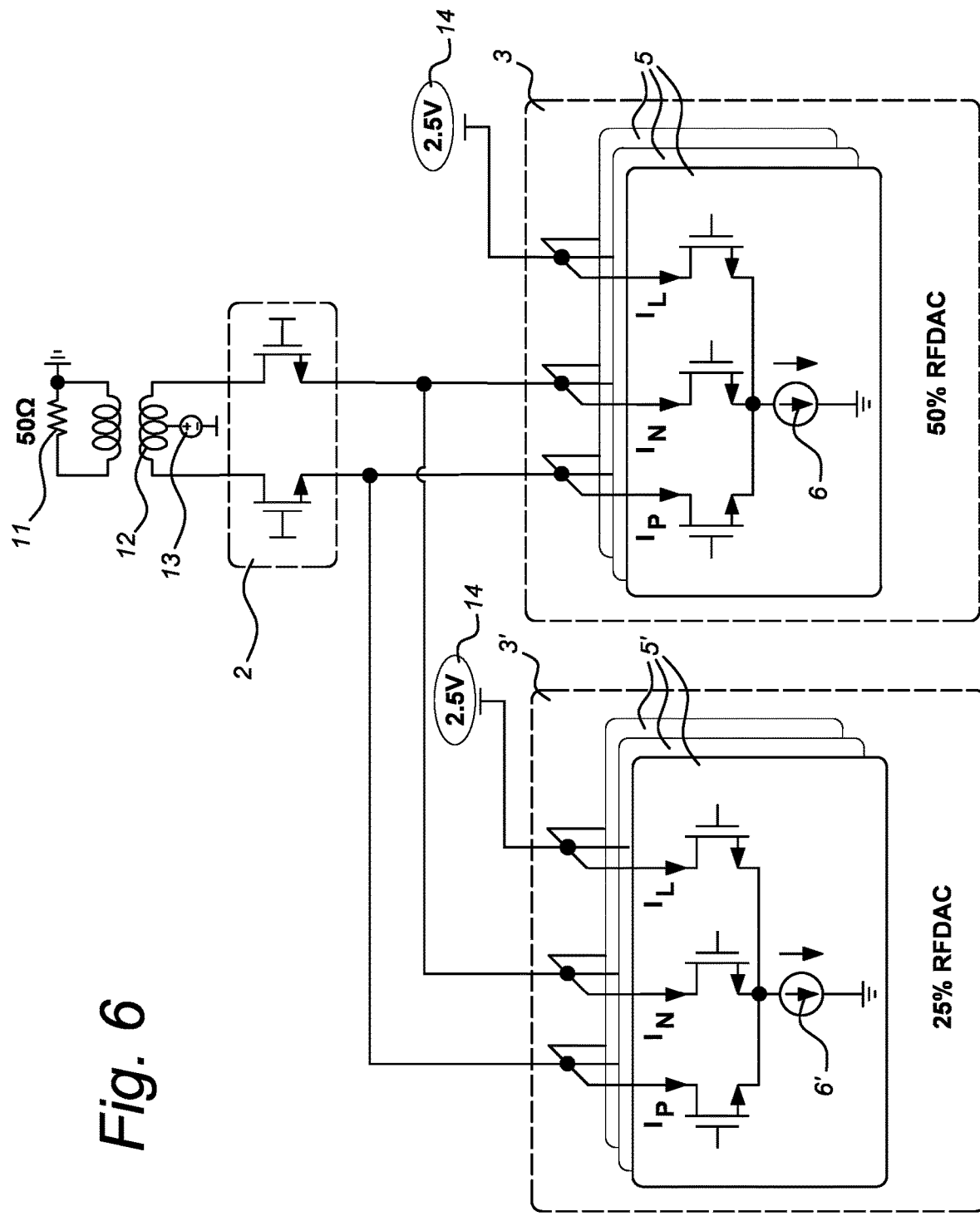
FIG. 6 shows a schematic diagram of a further embodiment of the present invention RF transmitter.

This effect is shown in the graphs as presented in FIGS. 5A-C. In other words, an embodiment of the present invention is provided, wherein the digitally controlled current source 3 comprises two parallel operated current-mode RFDAC's, a first RFDAC 3 having a clock duty cycle, and a second RFDAC 3' having a clock duty cycle, which is different from the clock duty cycle of the first RFDAC 3. FIG. 6 shows a schematic diagram of an embodiment of the present invention RF transmitter 1, provided with the first and second RFDAC 3, 3'. In a further embodiment, the digitally controlled current source 3 is arranged to apply harmonic rejection by controlling a ratio of the duty cycle and/or ratio of current magnitude of the first and second RFDACs. Examples of these ratios are provided above.

By applying this technique in combination with the proposed current diversion path 4, very high linearity, and improved efficiency can be reached using the proposed embodiment. Note that the approach followed in [7] without the current diversion path is mostly focused on narrowband signals and requires extensive calibration techniques to achieve reasonable spectral accuracy, while still does not meet the commonly used spectral mask requirement of −45 dBc for the ACRL levels.

The proposed TX configuration with current diversion path 4 in the embodiments described herein, also offers high flexibility to implement refinements to the current drive conditions, which can be used to obtain a further enhanced efficiency or linearity. E.g. one can tailor the current profiles such that the complete switching-off of the current source 6 and/or active CG/CB configured output stage 2 is avoided. As such, one can avoid the negative impact of charge-storage non-linearity and maintain the high output impedance of the DDRM 3 driving the CG/CB configured output stage 2, by keeping the CG/CB configured output stage 2 always above a "minimum" guaranteed threshold current level, which flows through the CG/CB configured output stage(s) 2 at all times. To obtain this effect, in a further embodiment, the digitally controlled current source 3 is arranged to provide a predetermined minimum current level to each of the one or more CG/CB configured output stages 2. In addition, or alternatively, in a further embodiment, each of the unit cells 5 comprise a current source 6 which is reconfigurable during operation.

Figure 7B:
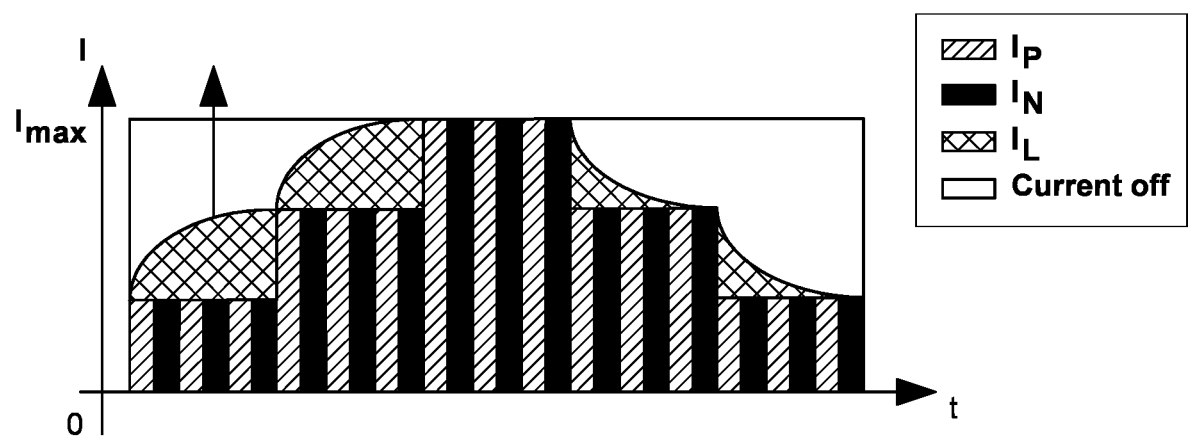

As an even further enhancement of the proposed RF transmitter 1 embodiments, also improved dynamic biasing concepts can be implemented, which allow to further enhance the efficiency of the proposed TX configuration, when handling signals with a large peak-to-average power ratio. Thus, in a further invention embodiment, the digitally controlled current source 3 is arranged to pre-activate one or more of the unit cells 5 using the current diversion path 4 during operation. In such an approach at lower RF output power, the unused current sources 6 at the PBO regions are turned off (the shift from white-rectangular region to the shaded circular/hyperbolic sector area in FIG. 7B). However, note that the current source 6 turn-on process takes more than 50 ns due to the large device area of NMOS current sources (the turn-off process is not critical). This long turn-on time degrades the quality of the output signal in conventional DDRM 3 implementations without current diversion path 4. In contrast the presence of the current diversion path 4 allows now to pre-activate the current sources 6 in the unit cell 5 to avoid the negative impact of their activation time constants. In this way, the unit cells 5 can reach their aimed steady-state current level prior to their actual use to construct the RF output signal. As such larger bandwidth signals can be handled accurately at a reduced current consumption of the DDRM 3. Note that due to the current diversion path 4 the CG/CB configured output stage 2 can be operated in "class-B/class-F like" operation at all times, but now also with a reduced power consumption of the driving DDRM 3 itself, which further improves the overall RF transmitter 1 system efficiency. The principle of this technique is indicated in FIGS. 7A and 7B, which respectively show the situation without dynamic biasing and improved dynamic biasing.

In an even further embodiment, the RF transmitter 1 further comprises a control unit connected to the one or more CG/CB configured output stages 2 and digitally controlled current source 3, the control unit being arranged to apply an energy efficiency enhancement scheme in the form of load modulation and/or supply modulation. This will even further enhance the TX system efficiency for modern communication signals with a large peak-to-average power ratios (PAPR). The previously proposed techniques can be combined with existing efficiency techniques like load modulation (Doherty or outphasing like concepts) or supply modulation techniques like e.g. envelop tracking. Note that implementation of these techniques would directly benefit from the digital nature of the DDRM 3, allowing improved branch control or synchronization with supply modulation techniques.

To improve even further for linearity and reduce the impact of the remaining mismatch in the underlying devices, layout dependencies and timing mismatch defects, dynamic element matching can be applied in the RF transmitter 1 to improve for the signal quality. In an embodiment, the RF transmitter 1 comprises unit cells 5 which are dynamic element matched. The dynamic element matching e.g. relates to a technique, where thermometer bits are randomized in their use, in an attempt to also randomize their error. For narrowband signals this randomization works best, improving their output spectrum.

It should be noted that this technique is most effective for modulated signals with a not too large video bandwidth (e.g. up to 20 MHz), see also the article C. Lin, et al., "A 16b 6GS/S Nyquist DAC with IMD <−90 dBc up to 1.9 GHz in 16 nm CMOS" ISSCC, pp.360-361, Feb. 2018.

The embodiments described above were directed at polar implementations of RF transmitters 1, e.g. using a DDRM as digitally controlled current source 3. However polar architectures are known for their notorious bandwidth expansion, which yields video bandwidth restrictions in practical TX implementations (e.g. for signals having a video/modulation bandwidth above 80 MHz). In view of this, Cartesian implementations of digitally controlled current source 3 architectures are expected to perform better in terms of video or modulation bandwidth. Similar to what has been previously described for polar architectures, also Cartesian DDRM 3 solutions driving a CG/CB configured output stage 2 in current mode can strongly benefit from the use of a current diversion path 4 for the DDRM 3.

It is important to realize that, just like in the polar case, also in a Cartesian DDRM the complementary I and Q baseband signals are first digitally interpolated to adequately suppress sampling spectral replicas and locate them further away from the original complex modulated baseband signal (the interpolation process is the combination of digital up-sampling and digital low pass filter operation). Next, they are up-converted by two complementary quadrature clocks. The resultant high-speed bit-streams are subsequently converted into two separate I/Q RF signals by exploiting current-steering (mixing) DACs. Eventually, they are combined in an analog fashion by hardwiring their I and Q output RF signals. Existing DDRM 3 implementations still suffer from the following limitations. Most prior art DDRMs using a Cartesian architecture are implemented using two separate IQ-banks operating in class-A for the implementation of their current-steering mixing DACs (see the prior art example shown in FIG. 1A). The use of two distinct banks results in IQ mismatch, due to tiny component variations/imperfections, and as a result, these structures tend to suffer from unwanted IQ image components, degrading the in-band linearity, i.e., error-vector magnitude (EVM). However, the basic Cartesian configuration also requires the use of 25% quadrature clocks to lower I-Q interaction, which in turn yields by a lower RF output power of the final stage. Note, that when using 50% quadrature clocks with this architecture, ternary state up-converted current pulses occur with a 75% duty-cycle, which causes strong I-Q interaction which degrades in-band linearity and out-of-band signal purity especially for wideband signals.

It is also important to note, that the use of two separate banks for generating the I and Q components almost automatically yields the use of separate current sources in the unit cells for generating these I and Q components. This use of two distinct current sources further degrades the achievable IQ image rejection and EVM of such an architecture due to tiny differences between these current sources.

A more sophisticated Cartesian DDRM implementation is given in [5]. Here the two banks are replaced by one IQ-sharing/IQ interleaving topology in which the I and Q banks share the same unit cell hardware (improving the IQ image rejection). While the proposed complementarity IQ banks in [5] improves odd-order distortion and IQ image rejection, also this architecture uses two separate current sources to generate its differential RF output signal. Any mismatch among these current sources contributes to even order distortion, see Reference [2]. Furthermore, its bit-wise XOR operation of the I/Q vectors produces binary output current pulses with a 75% duty-cycle. This exacerbates the impact of the finite settling times for the unit cells 5, which limits the achievable spectral purity for wideband signals.

In conclusion, all currently known Cartesian DDRM 3 implementations aiming for high linearity, use unsigned IQ/class-A like operation and do not switch off their current sources with the envelope of the TX signal. Therefore, it is not possible with these configurations to provide highly accurate class-B like output currents that can drive an (external) CG/CB configured output stage 2 in an energy efficient operation.

Figure 8B:
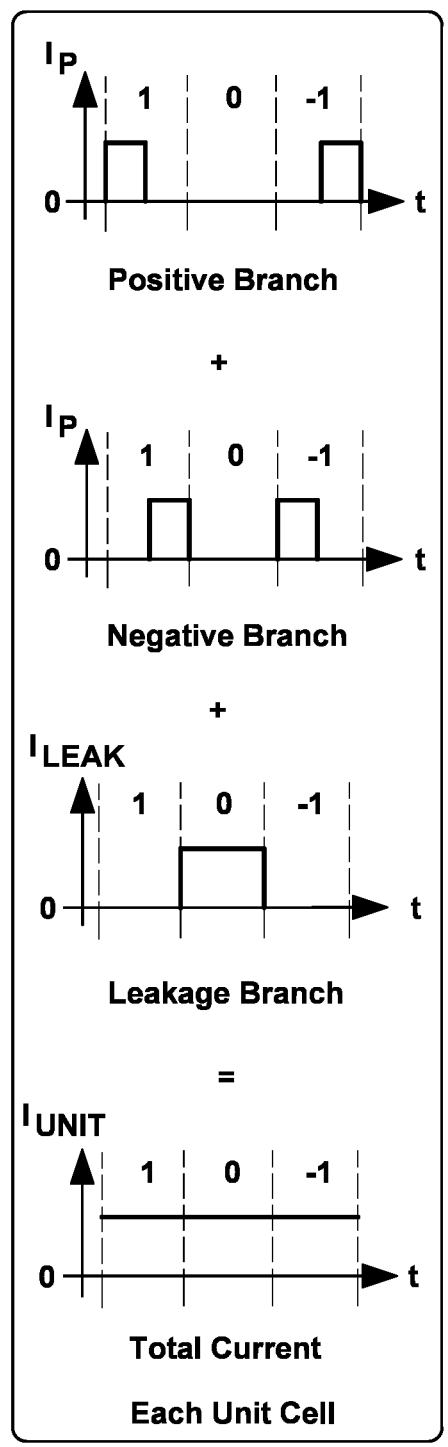
FIG. 8A shows schematic diagram of a further embodiment of the present invention of a Cartesian type DDRM implementation with current diversion paths, FIG. 8B graphs of its unit cell up-converted current waveform, and FIG. 8C a schematic diagram of a further embodiment of the present invention with an IQ-interleaving DDRM.
Figure 8C:
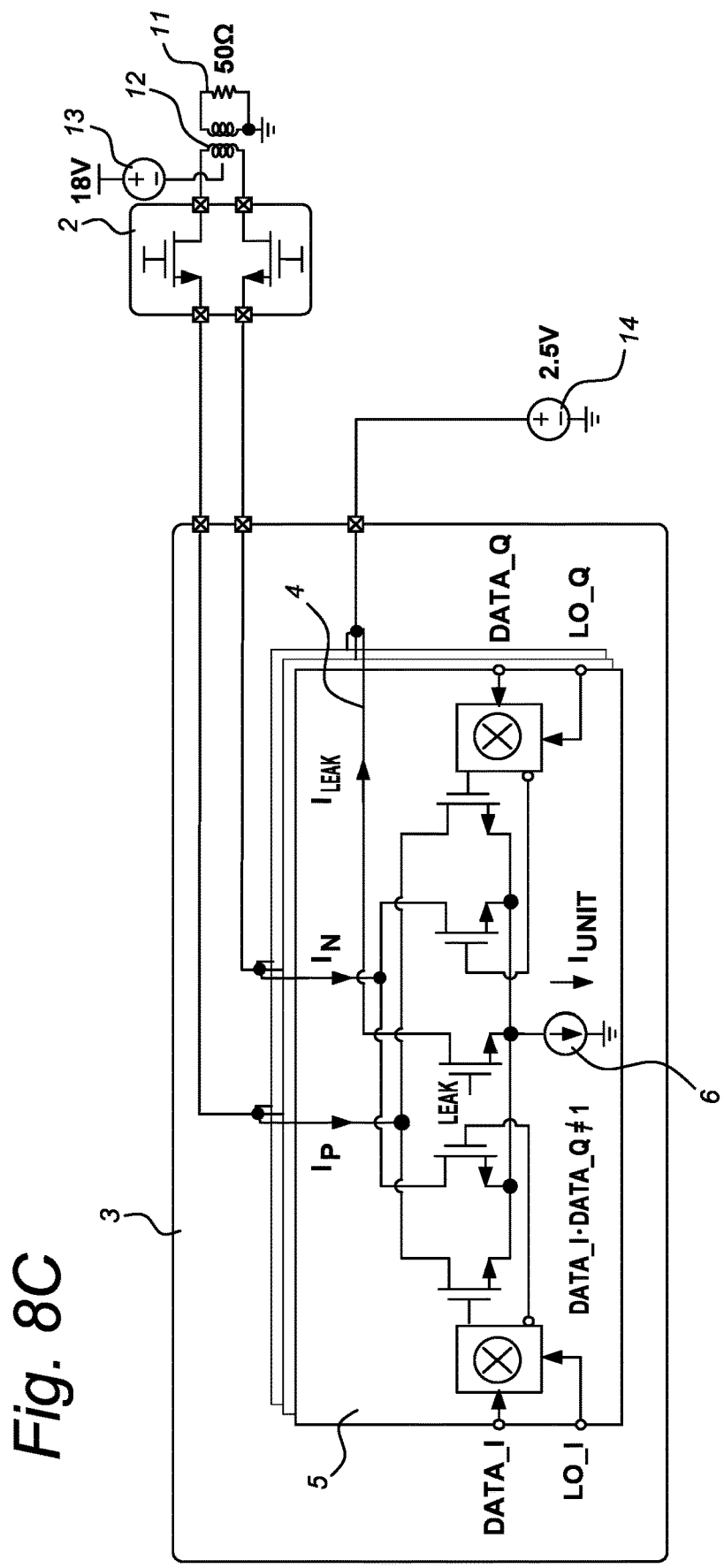

The novel IQ DDRM 3 configurations depicted in FIGS. 8A and 8C use the present invention feature of a current diversion path 4 to achieve the desired current clipping function (signed operation) in the digital domain.

In FIG. 8A the schematic diagram is given of a Cartesian DDRM 3 core architecture, which uses two separate switch banks with cell units 5 and associated current sources 6 to implement the I and Q functionality. But in contrast with prior art it features the additional current diversion path 4, representing a first Cartesian embodiment of the present invention.

Thus, in a further embodiment, the digitally controlled current source 3 is a Cartesian operated digitally controlled current source 3. In a further embodiment, the Cartesian operated digitally controlled current source 3 is arranged to apply an interleaving technique. More in particular, each unit cell 5 comprises two current sources 6 for constructing an I and Q signal, respectively. Using the I/Q interleaving technique helps to improve IQ image rejection, in-band linearity and close-in spectral purity.

A second embodiment involves an improved architecture to reduce the IQ image component as well. This embodiment features an I/Q-sharing/I/Q interleaving topology in which the I and Q banks share the same unit cell 5 hardware but with only one current source 6, while having in addition a current diversion path 4 that allows to use this structure in signed/class-B like configuration, as shown in the exemplary embodiment of FIG. 8C. In this exemplary embodiment, each unit cell 5 comprises one current source 6 (which is e.g.

used for constructing an I signal and a Q signal alternating in time). Using the I/Q interleaving techniques and a single current source 6 in the unit cell 5 to construct both I and Q, will even further improve IQ image rejection, in-band linearity and close-in spectral purity.

Thanks to the current diversion path 4, each unit cell 5 in the FIGS. 8A and 8C embodiments can generate three different logical states, namely 1, 0, and −1, enabling the signed operation while keeping all current sources on all the time, as shown in the graphic representations of FIG. 8B. As such, these signed IQ DDRM 3 embodiments can execute the digitally controlled clipping function, allowing the current-mode driven CG/CB configured output stage 2 to operate in class-B like conditions without negatively affecting the overall TX linearity. Note that this can be also observed by considering the fact that $(I_p+I_n+I_t)$ becomes constant (FIG. 8B) and equal to the corresponding current source 6 of the unit cell 5 ($I_{UNIT}$). This result in the high linearity—high efficiency TX operation as has been previously discussed for polar configurations. However, since the DDRM 3 configurations of FIGS. 8A and 8C are now Cartesian in nature also much larger modulation bandwidth can be supported.

To circumvent the IQ image component as a result of employing two separate I/Q banks, a novel I/Q-interleaving DDRM is proposed and conceptually illustrated in FIG. 8C. In this context, the proposed IQ unit cell comprises data and sign bits: $D_I, S_I, D_Q, S_Q, D_I, \overline{S_I}$, and $D_Q, \overline{S_Q}$. Subsequently, the bitwise up-conversion is performed using the bitwise multiplication of the current-mode XOR/XNOR of the quadrature LO clocks with the related decoded data. The architecture of these circuits are the same in both 50% and 25% mixing-DACs (see the exemplary schematic diagrams of FIGS. 9A and 9B). For the current diversion path 4, however, the local decoding is different because in a 25% RFDAC case, when one of the IQ data becomes a logical one, the current diversion path 4 still carries current. Note that it is crucial to generate the 25% LO clock locally inside each mixing unit of the 25% mixing-DAC using a bitwise AND operation of two 50% quadrature clock signals, since this minimizes the delay mismatch between the two LO distribution networks. As mentioned earlier, the proposed mixing unit is created, exploiting only one single-current source, thus, reducing the IQ mismatch.

Figure 10:
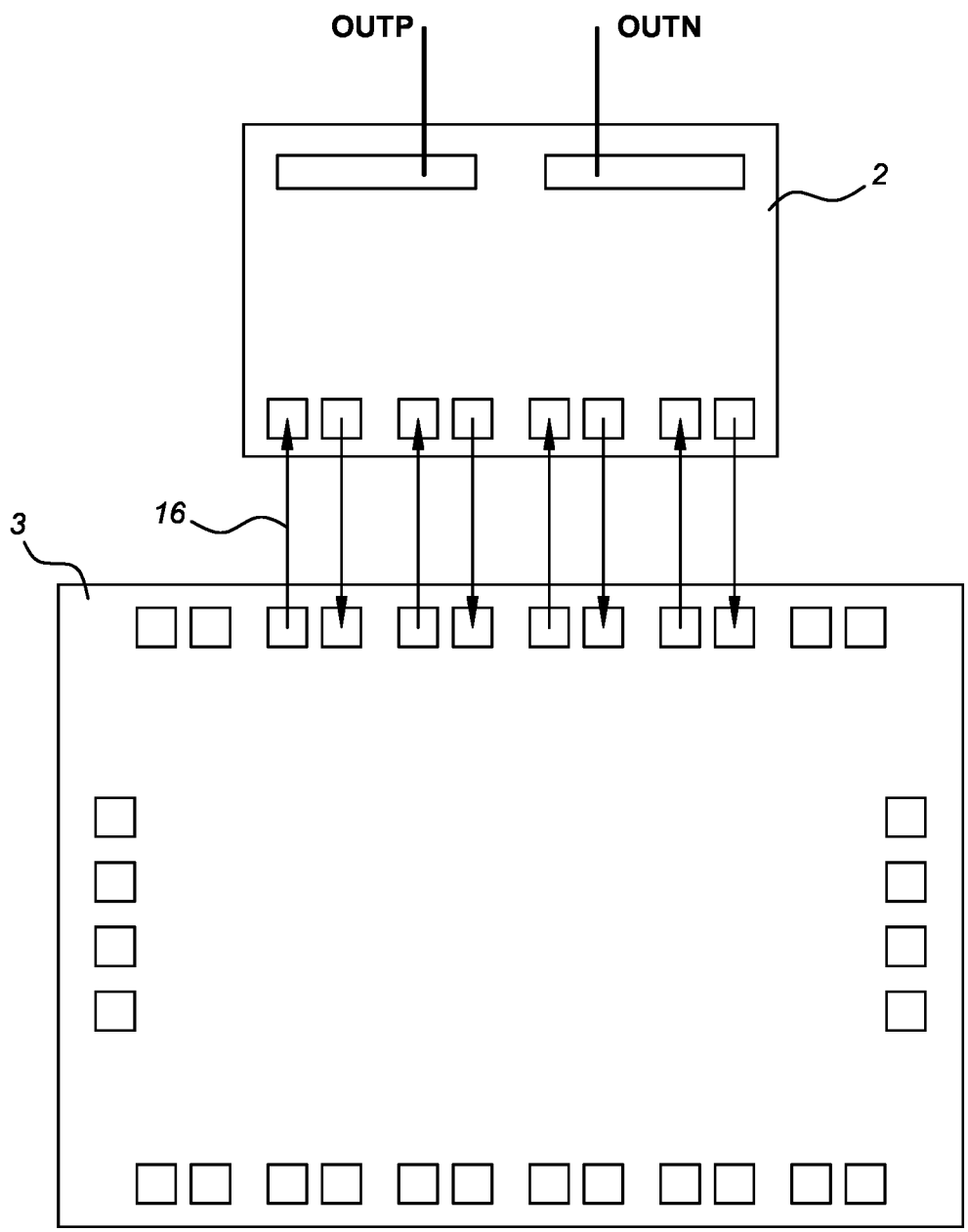
FIG. 10 shows a conceptual view of a DDRM current-mode driver and a bond-wire interconnected GaN integrated circuit with CG/CB configured output stages.

When aiming for even higher powers, the impedance levels provided by the CG/CB configured output stage 2 becomes very low. If these CG/CB configured output stages 2 are implemented in a power/high breakdown voltage technology like LDMOS or GaN, interconnects between these ICs for driving the CG/CB configured output stage 2 are needed. When using bond wire techniques, these bond wires will have inductances resulting in a reactive impedance which is in series with the impedance offered by the CG/CB configured output stage 2. This reactive impedance becomes higher with the RF operating frequency and can overwhelm the input impedance of the CG/CB configured output stage 2 itself. Although one might think this is not a problem in a current mode drive system, the required voltage swing for driving this current by the DDRM 3 becomes larger. This increased voltage-swing will degrade the achievable linearity of the DDRM 3 and at some points will lead to unwanted clipping/voltage saturation of the DDRM 3. Therefore, in practical situations it is often advantageous to split the CG/CB configured output stage 2 in multiple smaller (differential) stages, which their output connected, as such combining the output currents. Their multiple differential inputs can be connected best now by an array of interconnections, such as bond wires 16, where the opposite current directions of the multiple inputs help to lower the impact of mutual inductance between the bond wires 16. Thus, in a further embodiment, the RF transmitter 1 further comprises a plurality of differential CG/CB configured output stages 2 of which the respective inputs are connected to the digitally controlled current source 3 by an array of interconnects 16, the array of interconnects 16 having differential pairs of interconnects 16 with opposite current directions. In addition, since now the differential stage is split by N, also the terminal impedances go up by a factor N. Since the reactance due to the bond wire 16 inductance will stay in first order approximation equal, its impact on the overall loading of the DDRM 3 is drastically reduced. This is further detailed in FIG. 10 which shows a conceptual view of a DDRM current-mode driver 3 and a bond-wire interconnected GaN integrated circuit having the CG/CB configured output stages 2. This set-up has four differential pairs of common-gate configured devices 2 that have their drain terminals connected to each other. In this way the influence of the inductive connections/bond wires 16 can be lowered. This particular configuration is especially relevant when aiming for output powers above 1 W.

The present invention has been described above with reference to a number of exemplary embodiments as shown in the drawings. Modifications and alternative implementations of some parts or elements are possible, and are included in the scope of protection as defined in the appended claims.

List of References

[1] P. Eloranta, et al., "A Multimode Transmitter in 0.13 m CMOS using Direct-Digital RF Modulator," IEEE JSSC, vol. 42, no. 12, pp. 2774-2784, Dec. 2007.

[2] C. Erdmann et al., "A 330 mW 14 b 6.8 GS/s dual-mode RF DAC in 16 nm FinFET achieving −70.8 dBc ACPR in a 20 MHz channel at 5.2 GHz," in IEEE ISSCC Dig. Tech. Papers, Feb. 2017, pp. 280-281.

[3] Z. Deng, et al., "A dual-band digital-WiFi 802.11a/b/g/n transmitter SoC with digital I/Q combining and diamond profile mapping for compact die area and improved efficiency in 40 nm CMOS". ISSCC, pp.172-173, Feb. 2016

[4] M. S. Alavi, R. B. Staszewski, L.C.N. de Vreede, J. R. Long, "Orthogonal summing and power combining network in a 65-nm all-digital RF I/Q modulator," Radio-Frequency Integration Technology (RFIT), 2011 IEEE International Symposium, 2011, pp. 21-24

[5] Mohammadreza Mehrpoo, Mohsen Hashemi, Yiyu Shen, Leo De Vreede, Morteza Alavi, "A Wideband Linear I/Q-Interleaving Direct Digital RF Modulator". IEEE Journal of Solid-State Circuits, 2018, Volume: 53, Issue: 5.

[6] Varish Diddi ; Shuichi Sakata; Shintaro Shinjo; Voravit Vorapipat; Richard Eden; Peter Asbeck, Broadband digitally-controlled power amplifier based on CMOS/GaN combination, 2016 IEEE

[7] N. Markulic, et al, "A 5.5-GHz Background-Calibrated Subsampling Polar Transmitter With −41.3-dB EVM at 1024 QAM in 28-nm CMOS", IEEE Journal of Solid-State Circuits, 2019, Volume: 54, Issue: Radio Frequency Integrated Circuits Symposium (RFIC).

The invention claimed is:

1. An RF transmitter comprising
one or more common-gate, CG, or common-base, CB, configured output stages, and
a digitally controlled current source having a plurality of unit cells connected to the one or more CG/CB configured output stages, each of the plurality of unit cells comprising a current source, wherein the digitally controlled current source is configured for driving the one or more CG/CB configured output stages with respective driving currents originating from the associated current source in each of the plurality of unit cells, in dependence of one or more input signals, and wherein the digitally controlled current source further comprises a current diversion path in each of the plurality of unit cells for providing a diversion current to a voltage source having a voltage lower than drain/collector terminals of transistors provided in the CG/CB configured output stages.

2. The RF transmitter according to claim 1, wherein the digitally controlled current source comprises a direct digital RF modulator, DDRM.

3. The RF transmitter according to claim 1, wherein the digitally controlled current source comprises a RF digital-to-analogue converter, RFDAC.

4. The RF transmitter according to claim 1, wherein the digitally controlled current source is arranged to provide a predetermined minimum current level to each of the one or more CG/CB configured output stages.

5. The RF transmitter according to claim 4, wherein the digitally controlled current source comprises two parallel operated current-mode RFDAC's, a first RFDAC having a clock duty cycle, and a second RFDAC having a clock duty cycle, which is different from the clock duty cycle of the first RFDAC.

6. The RF transmitter according to claim 5, wherein the digitally controlled current source is arranged to apply harmonic rejection by controlling a ratio of the duty cycle and/or ratio of current magnitude of the first and second RFDACs.

7. The RF transmitter according to claim 1, wherein the digitally controlled current source is arranged to pre-activate one or more of the unit cells using the current diversion path during operation.

8. The RF transmitter according to claim 1, further comprising a control unit connected to the one or more CG/CB configured output stages and digitally controlled current source, the control unit being arranged to apply an energy efficiency enhancement scheme in the form of load modulation and/or supply modulation.

9. The RF transmitter according to claim 1, wherein the RF transmitter comprises unit cells which are dynamic element matched.

10. The RF transmitter according to claim 1, wherein the digitally controlled current source is a Cartesian operated digitally controlled current source.

11. The RF transmitter according to claim 10, wherein the Cartesian operated digitally controlled current source is arranged to apply an interleaving technique.

12. The RF transmitter according to claim 11, wherein each unit cell comprises one current source providing a constant current during operation.

13. The RF transmitter according to claim 1, wherein the CG/CB configured output stages are single-ended or differential.

14. The RF transmitter according to claim 1, comprising a plurality of differential CG/CB configured output stages of which the respective inputs are connected to the digitally controlled current source by an array of interconnects, the array of interconnects having differential pairs of interconnects with opposite current directions.

* * * * *